United States Patent
Ogawa

(10) Patent No.: US 6,356,321 B1
(45) Date of Patent: Mar. 12, 2002

(54) LIQUID CRYSTAL DISPLAY PANEL HOLDER

(75) Inventor: Yuji Ogawa, Tokyo (JP)

(73) Assignee: Asahi Kogaku Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/292,925

(22) Filed: Apr. 16, 1999

(30) Foreign Application Priority Data

Apr. 17, 1998 (JP) .......................................... 10-108035

(51) Int. Cl.[7] .......................................... G02F 1/1333
(52) U.S. Cl. ......................................... 349/58; 349/149
(58) Field of Search .......................... 339/176; 349/125, 349/58, 150, 152, 49, 151

(56) References Cited

U.S. PATENT DOCUMENTS

| | | | | |
|---|---|---|---|---|
| 4,113,342 A | * | 9/1978 | Weston | 339/176 |
| 4,225,257 A | * | 9/1980 | Andraggi | 403/24 |
| 4,509,811 A | * | 4/1985 | Amano et al. | 339/17 |
| 4,896,946 A | * | 1/1990 | Suzuki et al. | 350/336 |
| 5,274,486 A | * | 12/1993 | Yamazaki et al. | 359/83 |
| 5,442,470 A | * | 8/1995 | Hashimoto | 359/83 |
| 5,453,855 A | * | 9/1995 | Nakamura | 359/49 |
| 5,676,569 A | * | 10/1997 | Davis | 439/731 |
| 5,748,444 A | * | 5/1998 | Honda et al. | 361/678 |
| 5,933,018 A | * | 8/1999 | Komatsu | 324/775 |
| 6,095,272 A | * | 8/2000 | Takiguchi | 180/90 |
| 6,095,856 A | * | 8/2000 | Horan et al. | 439/567 |
| 6,176,708 B1 | * | 1/2001 | Michiya | 439/66 |
| 6,263,070 B1 | * | 7/2001 | Kobo et al. | 379/368 |

FOREIGN PATENT DOCUMENTS

JP          10133187          4/1998

* cited by examiner

*Primary Examiner*—William L. Sikes
*Assistant Examiner*—Hoan Nguyen
(74) *Attorney, Agent, or Firm*—Greenblum & Bernstein, P.L.C.

(57) ABSTRACT

A press plate has a frame portion in contact with the top surface of a liquid crystal display panel, a plurality of legs having engagement hook at the distal end thereof, and a first rib and rubber connector holding portions which hold a rubber connector therebetween in contact with the back surface of the frame portion. When the respective legs are inserted into fixing holes in a circuit board while the liquid crystal display panel is in contact with the back face of the frame portion and the rubber connector is inserted between a first rib and the rubber connector holding portions, the engagement hooks are caught by the fixing holes in the circuit board while the rubber connector is collapsed. Thereby, the liquid crystal display panel is fixed to the circuit board, by which the falling and shift of position of the rubber connector can be prevented.

12 Claims, 4 Drawing Sheets

LIQUID CRYSTAL DISPLAY PANEL HOLDER

BACKGROUND OF THE INVENTION

1. Field of the Invention

The present invention relates to a liquid crystal display panel holder which fixes a liquid crystal display panel on a circuit board. The present disclosure relates to subject matter contained in Japanese Patent Application No. 10-108035 (filed on Apr. 17, 1998), which is expressly incorporated herein by reference in its entirety.

2. Description of the Related Art

A liquid crystal display panel used for an electronic equipment or the like is connected to a circuit board within the electronic equipment through a rubber connector (a prismatic rubber consisting of conductive rubbers and insulating rubbers disposed in the conductive rubber in a striped form) arranged between the liquid crystal display panel and the circuit board. For this reason, a structure shown in an exploded view of FIG. 4 has conventionally been used as a liquid crystal display panel holder for fixing the liquid crystal display panel on the circuit board. In FIG. 4, a rubber connector 101 and a liquid crystal display panel 102 are surmounted on a circuit board 100, and the liquid crystal display panel 102 is covered by a frame-shaped press plate 103. Legs 103a formed at the four corners of the press plate 103 are engaged with engagement holes 100b formed in the circuit board 100 while the press plate 103 is pressed toward the circuit board 100 against the elastic force of the rubber connector 101. By this configuration, the rubber connector 101 is pressed onto terminals formed on the back surface of the liquid crystal display panel 102 an electrode (land) 100a formed on the circuit board 100.

However, according to the conventional liquid crystal display panel holding structure, since the press plate 103 merely covers the rubber connector 101 and the liquid crystal display panel 102 surmounted on the circuit board 100, the assembling worker must adjust the position of the rubber connector 101 manually. Therefore, the conventional liquid crystal display panel holder has problems in that the efficiency of the assembling work for fixing the liquid crystal display panel 102 is low and in that the shift of position or tilt of the rubber connector 101 results in poor conduction between the conductive rubber of the rubber connector 101 and the terminals of the liquid crystal display panel 102 or the electrode 100a of the circuit board 100.

Although, in order to solve the above problems, protrusions for positioning the rubber connector 101 on the circuit board 100 might be formed projectingly, the formation of these protrusions reduces the manufacturing efficiency etc. of the circuit board 100, so that such a structure is difficult to be adopted.

SUMMARY OF THE INVENTION

An object of the present invention is to provide a liquid crystal display panel holder which can solve the above problems, which can be realized merely by slightly changing the conventional manufacturing process of a press plate without reducing the manufacturing efficiency etc. of the circuit board, and which can securely effect the positioning and prevention of tilt of the rubber connector, by which the efficiency of assembly work can be improved.

A first aspect of the liquid crystal display panel holder in accordance with the present invention is a liquid crystal display panel holder for fixing the liquid crystal display panel on the circuit board. The liquid crystal display panel holder comprises a press plate having a rectangular frame portion in contact with the top surface of the liquid crystal display panel, a first rib formed so as to project from an edge of the frame portion, second and third ribs formed so as to project from edges adjacent to both sides of the edge at which the first rib is formed projectingly, and the press plate having holding portion which is formed so as to project from the second or third ribs and extend in parallel with the first rib. The liquid crystal display panel holder also comprises prismatic rubber connector which is inserted between the first rib and the holding portion and holds the liquid crystal display panel between itself and the frame portion and fixing mechanism fixing the press plate to the circuit board in a state in which the rubber connector is deformed elastically.

Being thus-configured, since the rubber connector is inserted between the first rib and the holding portion while holding the liquid crystal display panel between the rubber connector and the frame portion, the rubber connector is held and positioned by the first rib and the holding portions. Therefore, in the process of assembly, the position of the rubber connector is not shifted with respect to the liquid crystal display panel and the rubber connector does not fall down. Therefore, the efficiency of assembly work is improved.

In a second aspect of the liquid crystal display panel holder in accordance with the present invention, the fixing mechanism includes a plurality of legs provided integrally with the press plate and which are provided integrally with the press plate and inserted into a plurality of holes formed in the circuit board.

In a third aspect of the liquid crystal display panel holder in accordance with the present invention, the leg has, at the tip end thereof, a hook caught by an opening edge of the hole on the back surface side of the circuit board.

In a fourth aspect of the liquid crystal display panel holder in accordance with the present invention, there is provided a space having a width approximately equal to the width of the rubber connector between the holding portion and the first rib By this configuration, the worker can insert the rubber connector between the first rib and the holding portion with a small force without strong force pushing the rubber connector while elastically deforming it.

In a fifth aspect of the liquid crystal display panel holder in accordance with the present invention, the holding portion are formed by bending the end portions of the second or third ribs adjacent to the first rib in parallel with the first rib. By this configuration, the whole portion of the press plate can be formed from one plate at a time by pressing.

In a sixth aspect of the liquid crystal display panel holder in accordance with the present invention, the end portion of the second or third rib adjacent to the first rib is divided into two portions by a slit in parallel with the frame portion, and the portion between the slit and an edge of the rib is bent, thereby forming the holding portions.

In a seventh aspect of the liquid crystal display panel holder in accordance with the present invention, the edge of the second or third rib between the frame portion and the slit adjacent to the first rib is closer to the first rib than the bend position of the holding portion.

In an eighth aspect of the liquid crystal display panel holder in accordance with the present invention, a protrusion is formed on a surface of the first rib at a location facing the holding portion, and the distance between the pole of the protrusion and the holding portion is smaller than the width of the rubber connector. By this configuration, while the rubber connector can be inserted with a small force, the rubber connector is prevented from coming off from the press plate.

BRIEF DESCRIPTION OF THE DRAWINGS

The invention will be described below in detail with reference to the accompanying drawings, in which.

DESCRIPTION OF THE PREFERRED EMBODIMENT

Figure 1:
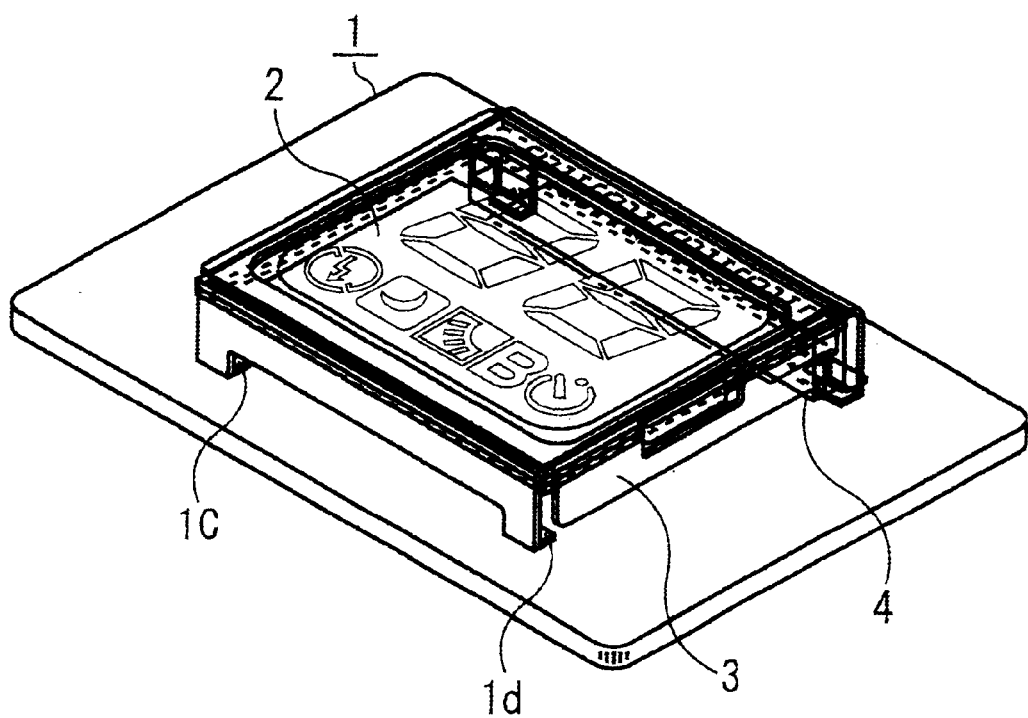
FIG. 1 is a perspective view showing an embodiment of a liquid crystal display panel holder in accordance with the present invention.
Figure 2:
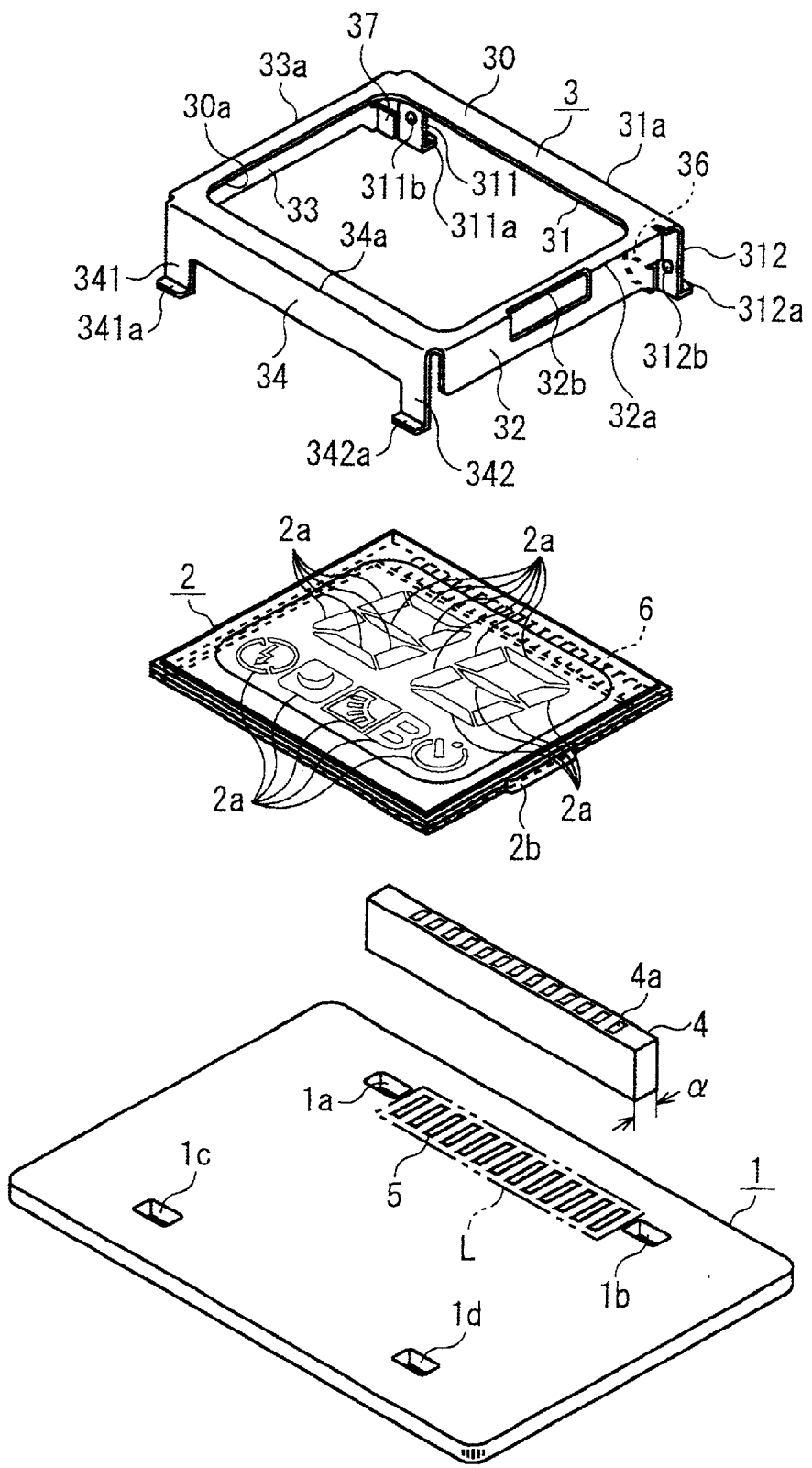
FIG. 2 is an exploded view of the liquid crystal display panel holder shown in FIG. 1.

FIG. 1 is a perspective view showing an assembled state of a liquid crystal display panel holder of this embodiment, partially seen through, and FIG. 2 is an exploded perspective view showing the shapes of elements constituting the liquid crystal display panel holder.

A liquid crystal display panel 2 is for example, a reflective STN (super-twisted-nematic) liquid crystal display panel, includes a plurality of electrodes 2a formed into a predetermined shape in advance and displays a desired character or figure when a voltage is selectively applied to each electrode 2a. In order to make possible the application voltage to the electrode 2a from the outside, a plurality of terminals 6 which conduct to the electrodes 2a are formed on the back surface of the liquid crystal display panel 2. At one side edge of the liquid crystal display panel 2, a convex portion 2b is formed, which is a mark of sealing of a pouring port through which liquid crystal substances had been poured into the liquid crystal display panel 2.

A circuit board 1, made of a hard insulating member used as a base material, has a large number of circuit devices mounted thereon for the control of an electronic equipment. On the top and back surfaces of the circuit board 1, a wiring pattern is formed to conduct these circuit devices to each other. A part of this wiring pattern is formed as a striped terminal pattern 5 to conduct each of the terminals 6 of the liquid crystal display panel 2 to any circuit device. The striped terminal pattern 5 is formed over the whole rectangular region L extending in parallel with the edge of the circuit board 1 as shown in FIG. 2, which is referred to as a land L as a whole.

In the vicinity of each end of the land L on the circuit board 1, rectangular fixing holes 1a and 1b penetrating the circuit board 1 are formed with the longer sides thereof extending in the direction parallel with the lengthwise direction of the land L. Also, at positions at a fixed distance from the fixing holes 1a and 1b in the transverse direction of the land L, fixing holes 1c and 1d are formed, which have the same shape as that of the fixing holes 1a and 1b.

A rubber connector 4 is a highly insulating silicone rubber having a prismatic form, and a large number of conductive rubbers 4a penetrate the rubber connector 4 from the lower face to the upper face. The conductive rubbers 4a included in the rubber connector 4 are insulated from each other by the silicone rubber. The conductive rubber 4a conducts each terminal pattern 5 constituting the land L to the corresponding terminal 6 formed on the liquid crystal display panel 2.

The width of each of the conductive rubbers 4a included in the rubber connector 4 is narrower than the width of each terminal pattern 5 and the width of each terminal 6. The length of the rubber connector 4 in the lengthwise direction is equal to the width of the liquid crystal display panel 2 and greater than the length of land L in the lengthwise direction.

Figure 3:
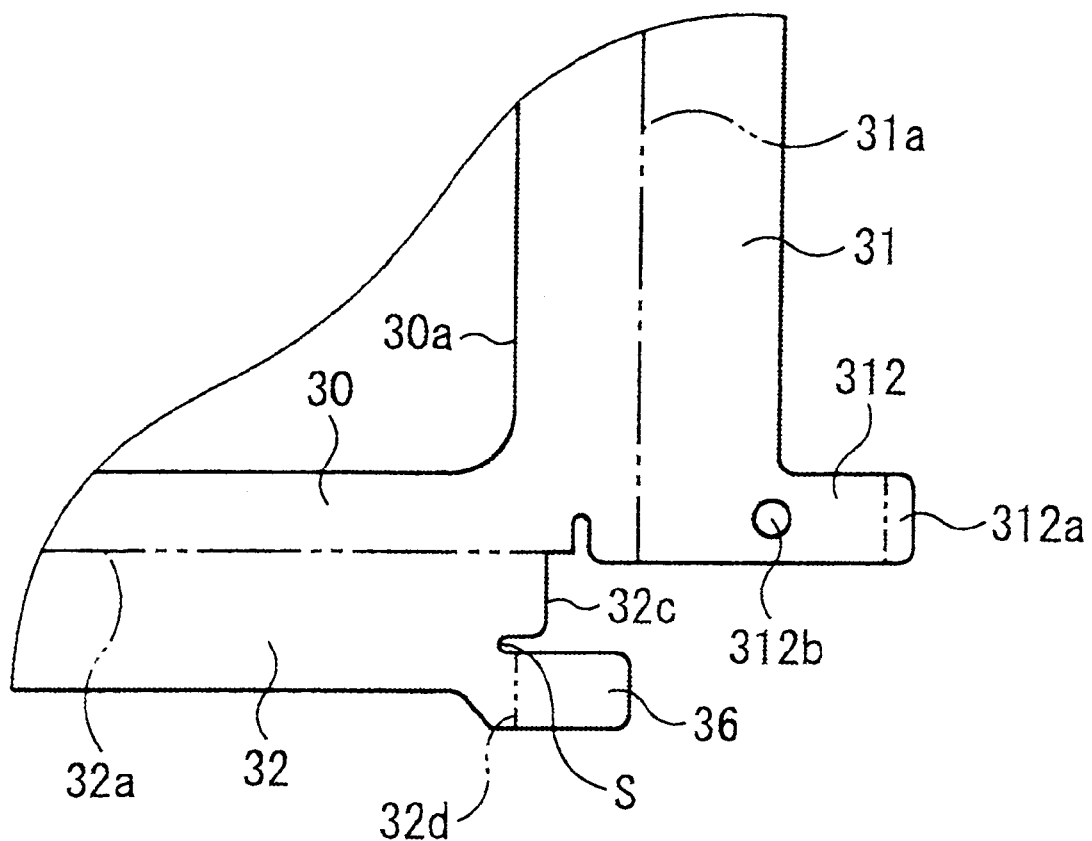
FIG. 3 is a development view of a press plate shown in FIG. 1.
Figure 4:
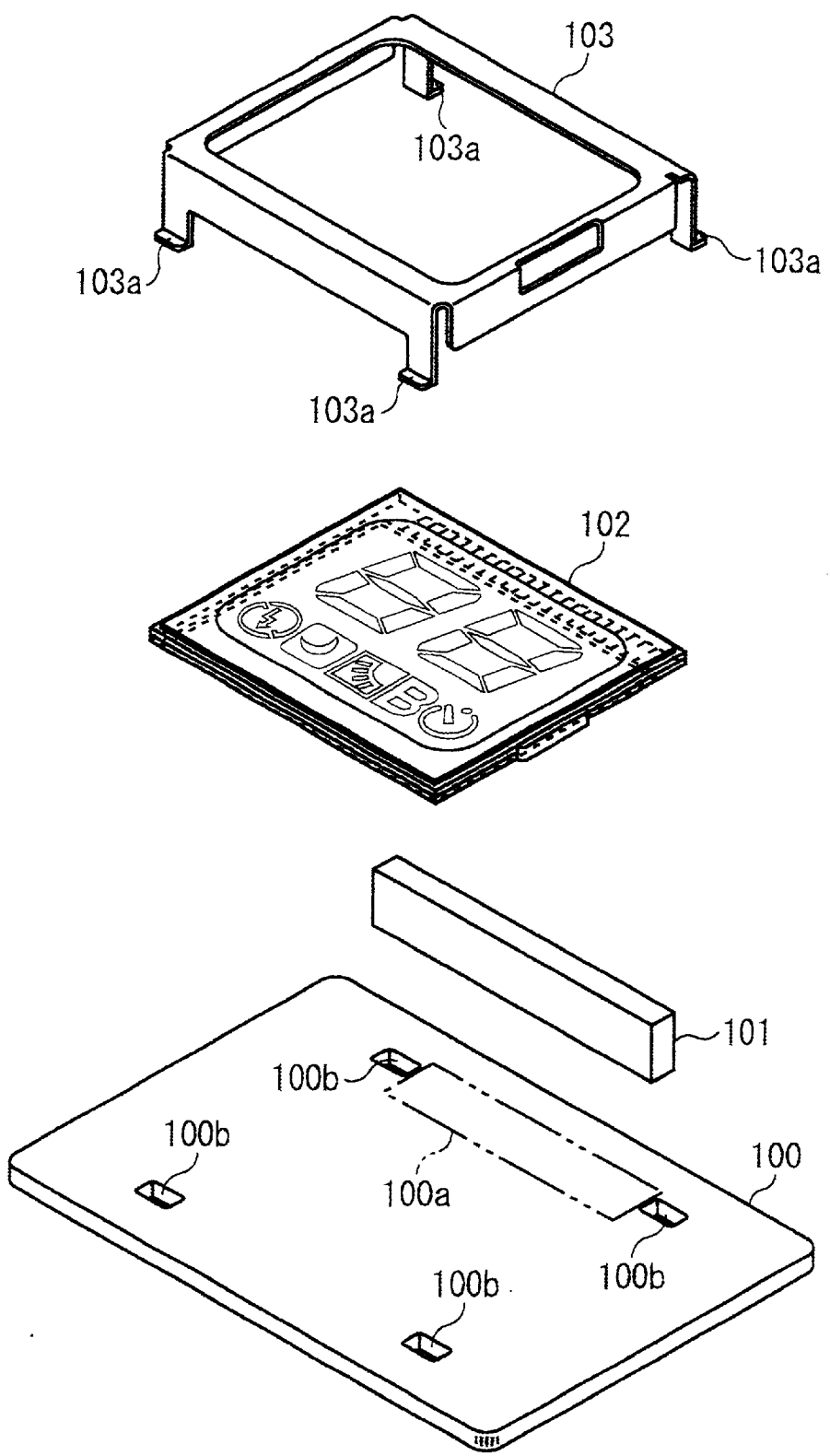
FIG. 4 is an exploded view of a conventional liquid crystal display panel holder.

A press plate 3 is fabricated by pressing a metal sheet. FIG. 3 is an enlarged view of a principal portion of the press plate 3 which is in a state it is just blanked out of a metal plate. In what follows, a description is made assuming that the upper side in FIGS. 1 and 2 is the upper side of the press plate 3.

As shown in the figures, the press plate 3 comprises a rectangular frame portion 30 for covering the top surface (display surface) of the liquid crystal display panel 2, a substantially rectangular first rib 31 integrally projecting from one longer side (bend line, 31a) of the frame portion 30, a substantially rectangular second rib 32 integrally projecting from one shorter side (bend line 32a) of the frame portion 30, a substantially rectangular third rib 33 integrally projecting from the other shorter side (bend line 33a) of the frame portion 30, and a substantially rectangular fourth rib 34 integrally projecting from the other longer side (bend line 34a) of the frame portion 30.

In the center of the frame portion 30 is formed a rectangular display window 30a for making information displayed on the top surface (display surface) of the liquid crystal display panel 2 visible. A portion having a frame shape at the periphery of the display window 30a comes into contact with the periphery of the liquid crystal display panel 2, and thereby performs a function of pressing the liquid crystal display panel 2 toward the circuit board 1.

The fourth rib 34 is bent at right angles downward (toward the circuit board 1) along the bend line 34a with respect to the frame portion 30. In the state in which the fourth rib 34 is bent in this manner, the bend line 34a corresponds to an upper edge of the fourth rib 34, and an edge parallel with the bend line 34a corresponds to a lower edge of the fourth rib 34. The width (the distance between the upper and lower edges) of the fourth rib 34 is larger than the thickness of the liquid crystal display panel 2, but smaller than the value obtained by adding the height of the rubber connector 4 to the thickness of the liquid crystal display panel 2.

Also, in the vicinity of each corner at the lower edge of the fourth rib 34, a first leg 341 and a second leg 342 are integrally formed, each of which extends in the same direction as a side edge of the fourth rib 34 (in the direction such that the leg is perpendicular to the frame portion 30 when the fourth rib 34 is bent). The distal ends of the first and second legs 341 and 342 are bent perpendicularly toward the outside (away from the first rib 31), by which engagement hooks 341a and 342a are formed.

The distance from the upper edge (bend line 34a) of the fourth rib 34 to the engagement hook 341a of the first leg 341 and the engagement hook 342a of the second leg 342 is slightly smaller than the sum of the thickness of the circuit board 1, the height of, the rubber connector 4, and the thickness of the liquid crystal display panel 2. Also, the width of the first leg 341 and the second leg 342 is slightly smaller than the width of the fixing holes 1c and 1d in the lengthwise direction of the circuit board 1.

The first rib 31 has a shape substantially symmetrical to the fourth rib 34. Specifically, the first rib 31 is bent at right angles downward (in the same direction as the fourth rib 34) along the bend line 31a with respect to the frame portion 30. The width (the distance between the bend line 31a and the lower edge) of the first rib 31 is equal to the width of the fourth rib 34. Also, in the vicinity of each corner at the lower edge of the first rib 31, a third leg 311 and a fourth leg 312 are integrally formed, each of which extends in the same direction as a side edge of the first rib 31 (in the direction such that the leg is perpendicular to the frame portion 30 when the first rib 31 is bent). The distal ends of the third and fourth legs 311 and 312 are perpendicularly bent toward the outside (away from the fourth rib 34), by which engagement hooks 311a and 312a are formed. The engagement hooks 311a and 312a have a size equal to that of the first and second engagement hooks 341a and 342a. However, at the roots of the third leg 311 and the fourth leg 312, on the inside face (the face opposed to the fourth rib 34) of the first rib 31, spherical convex portions 311b and 312b projecting semi-spherically are formed, respectively.

The second rib 32 is bent at right angles downward (toward the circuit board 1) along the bend line 32a with respect to the frame portion 30. The width (the distance between the bend line 32a and the lower edge) of the second rib 32 is equal to the width of the fourth rib 34. Also, substantially in the center of the upper edge (bend line 32a) of the second rib 32, a rectangular cut-out hole 32b is blanked so that the longer side thereof extends in the direction in parallel with the upper edge (bend line 32a) of the second rib 32. This cut-out hole 32b is formed into a size such that the convex portion 2b of the liquid crystal display panel 2 fits into the hole.

As shown in a development view of FIG. 3, the side edge portion of the second rib 32 adjacent to the first rib 31 is divided into upper and lower portions by a slit s parallel with the bend line 32a. The upper portion between the bend line 32a and the slit s is cut into a rectangular shape. By this cutting, the side edge 32c of the upper portion is formed so as to shift inwardly from and in parallel with the bent line 31a (that is, one longer side of the frame portion 30) by an amount slightly smaller than the width α of the rubber connector 4 in a state of FIG. 3. Also, at the proximal end of the lower portion between the slit s and the lower edge of the second rib 32, a bend line 32d is set so as to shift inwardly from and in parallel with the bent line 31a by a distance approximately equal to the width α of the rubber connector 4 in a state of FIG. 3. The part of the lower portion adjacent to the first rib 31 from the bend line 32d (hereinafter referred to as "a rubber connector holding portion 36") is bent at right angles toward the inside (toward the third rib 33) along the bend line 32d. The lower edge of the rubber connector holding portion 36 projects greatly downward from the lower edge of other portion of the second rib 32. Therefore, the rubber connector holding portion 36 faces the first rib 31 and the fourth leg 312 with a distance approximately equal to the width α of the rubber connector 4. The position of the spherical convex portion 312b is adjusted so as to face the rubber connector holding portion. 36 and the distance between the pole of the spherical convex portion 312b and the rubber connector holding portion 36 is smaller than the width α of the rubber connector 4.

The third rib 33 has a shape substantially symmetrical to the second rib 32. Specifically, the third rib 33 is bent at right angles downward (in the same direction as the fourth rib 34) along the bend line 33a with respect to the frame portion 30. The width (the distance between the bend line 33a and the lower edge) of the third rib 33 is equal to the width of the second rib 32. However, the third rib 33 is not formed with the cut-out hole 32b unlike the second rib 32. The distance between the third rib 33 and the second rib 32 is approximately equal to the length of the rubber connector 4 in the lengthwise direction.

The side edge portion of the third rib 33 adjacent to the first rib 31 is divided into upper and lower portions by a slit parallel with the bend line 33a. The side edge of the upper portion between the bent line 33a and the slit is separated from the first rib 31 by an amount slightly smaller than the width a of the rubber connector 4. Also, the lower portion between the slit and the lower edge of the third rib 33 is bent at right angles toward the inside (toward the second rib 32), by which a rubber connector holding portion 37 is formed. The lower edge of the rubber connector holding portion 37 projects greatly downward from the lower edge of other portion of the third rib 33. Also, the rubber connector holding portion 37 faces the first rib 31 and the third leg 311 with a distance approximately equal to the width α of the rubber connector 4. The position of the spherical convex portion 311b is adjusted so as to face the rubber connector holding portion 37 and the distance between the pole of the spherical convex portion 311b and the rubber connector holding portion 37 is smaller than the width α of the rubber connector 4.

In order to fix the liquid crystal display panel 2 on the circuit board 1 by using the press plate 3 having the above-described construction, the worker first inserts the liquid crystal display panel 2 between the back face of the frame portion 30 and the rubber holding portions 36 and 37 from the downside of the press plate 3 so that the liquid crystal display panel 2 contacts to the back face of the frame portion 30. At this time, the second rib 32 is expanded outward slightly by elastic deformation, by which the convex portion 2b of the liquid crystal display panel 2 is fitted into the cut-out hole 32b. Thereupon, the liquid crystal display panel 2 is fixed within the press plate 3, so that the subsequent work becomes easy to do.

Subsequently, the worker inserts the rubber connector 4 from the downside into a space surrounded by the inner surface of the first rib 31 (the surface facing the fourth rib 34), the side edge 32c of the second rib 32 adjacent to the first rib 31, the side edge of the third rib 33 adjacent to the first rib 31, and rubber connector holding portions 36 and 37. At this time, since the distance between the first rib 31 and the rubber connector holding portions 36 and 37 is set approximately equal to the width α of the rubber connector 4, the rubber connector 4 can be inserted easily without friction developed between the rubber connector 4 and the first rib 31 or the rubber connector holding portions 36 and 37. However, since the distance between the poles of the spherical convex portions 311b and 312b and the rubber connector holding portions 36 and 37 is set smaller than the width α of the rubber connector 4, the spherical convex portions 311b and 312b partially sink into the rubber connector 4, by which friction is developed partially between the spherical convex portions 311b and 312b and the rubber connector 4.

Thus, when the rubber connector 4 comes into contact with, the liquid crystal display panel 2 and the liquid crystal display panel 2, which is pushed up by the rubber connector 4, comes into contact with the back face of the frame portion 30, the rubber connector 4 is securely positioned by the side edge 32c of the second rib 32 adjacent to the first rib 31, the side edge of the third rib 33 adjacent to the first rib 31, and rubber connector holding portions 36 and 37, so that the falling of the rubber connector 4 is prevented. Also, the rubber connector 4 is prevented from coming off from the press plate 3 by the friction developed between the rubber connector 4 and the spherical convex portions 311b and 312b. Therefore, the worker can pick up the press plate 3.

Next, the worker elastically deforms the legs 311, 312, 341 and 342 of the press plate 3 inward (to the approaching side) and inserts the deformed legs 311, 312, 341 and 342 into the fixing holes 1a, 1b, 1c and 1d of the circuit board 1, respectively. Halfway through the insertion work, the lower face of the rubber connector 4 comes into contact with the upper surface of the circuit board 1. At this point of time, the worker removes the force of elastically deforming the legs 311, 312, 341 and 342, and pushes the whole of the press plate 3 toward the circuit board 1. Thus, the legs 311, 312, 341 and 342 further go into the fixing holes 1a, 1b, 1c and 1d while the rubber connector 4 is collapsed vertically by elastic deformation. After the claw-shaped portions at the tip ends of the hooks 311a, 312a, 341a and 342a pass through the fixing holes 1a, 1b, 1c and 1d, the elastically deformed legs 311, 312, 341 and 342 are restored to their original shape (spread outward), so that the engagement hooks 311a, 312a, 341a and 342a slip under the circuit board 1. At this point of time as well, the lower edges of the ribs 32 to 34 of the press plate 3 are separated from the top surface of the circuit board 1.

When the force of pushing the whole of the pressing plate 3 toward the circuit board 1 is removed, the liquid crystal display panel 2 and the frame portion 30 of the press plate 3 are subjected to a force in the direction such that they are separated from the circuit board 1 by the restoring force of the rubber connector 4 having been collapsed by elastic deformation. As a result, the engagement hooks 311a, 312a, 341a and 342a are pressed on the back surface of the circuit board 1, and are caught by the fixing holes 1a, 1b, 1c and 1d, by which the press plate 3 and the liquid crystal display panel 2 are fixed to the circuit board 1 (corresponding to fixing means).

In this fixed state, the movement of the liquid crystal display panel 2 in the direction where it goes away from the circuit board 1 is restricted by the frame portion 30 of the press plate 3, and the movement thereof in the direction where it approaches the circuit board 1 is restricted by the rubber connector 4. In this state, the rubber connector 4, which is compressed between the liquid crystal display panel 2 and the circuit board 1, is pressed onto the back surface of the liquid crystal display panel 2 and the land L on the circuit board 1. Therefore, each of the terminal patterns 5 formed on the circuit board 1 securely conducts to the corresponding terminal 6 of the liquid crystal display panel 2 via each conductive rubber 4a of the rubber connector 4.

Also, in this state, the shift of the liquid crystal display panel 2 with respect to the frame portion 30 of the press plate 3 is restricted by the ribs 31, 32, 33 and 34 of the press plate 3. Therefore, the terminal 6 of the liquid crystal display panel 2 and the terminal pattern 5 formed on the circuit board 1 do not shift with respect to the rubber connector 4.

Further, in this state, the transverse shift and falling of the rubber connector 4 are restricted by the first rib 31 and the rubber-connector holding portions 36 and 37 of the press plate 3. Also, the coming-off of the rubber connector 4 from the press plate 3 in the lengthwise direction of the rubber connector 4 is restricted by the side edge 32c of the second rib 32 adjacent to the first rib 31 and the side edge of the third rib 33 adjacent to the first rib 31. Therefore, the coming-off of the liquid crystal display panel 2 from the circuit board 1 caused by the falling or coming-off of the rubber connector 4 is prevented.

The aforementioned spherical convex portions 311b and 312b may be formed on the faces of the rubber connector holding portions 36 and 37 adjacent to the first rib 31, or may be formed on both of the first rib 31 and the rubber connector holding portions 36 and 37. Also, the shape of the spherical convex portions 311b and 312b is not limited to a spherical shape, and may take various shapes such as a cone and a truncated cone.

According to the liquid crystal display panel holder constructed as described above, the positioning and the prevention of falling of the rubber connector can be effected securely, by which the efficiency of assembly work is improved.

While there has been described a preferred form of the invention, obviously modifications and variations are possible in light of the above teachings. It is therefore to be understood that within the scope of the appended claims, the invention may be practiced otherwise than as specifically described.

We claim:

1. A liquid crystal display panel holder for fixing a liquid crystal display panel on a circuit board, comprising:
   a press plate having a rectangular frame portion configured to contact the top surface of the liquid crystal display panel, a first rib projecting from an edge of the frame portion, second and third ribs projecting from edges adjacent to both sides of the edge at which the first rib projects, and a holding portion that projects from at least one of the second and third ribs and extend in parallel with the first rib;
   a prismatic rubber connector which is positioned between the first rib and the holding portion and which holds the liquid crystal display panel between itself and the frame portion; and
   a fixing mechanism that fixes the press plate to the circuit board such that the rubber connector is elastically deformed.

2. The liquid crystal display panel holder according to claim 1, wherein the fixing mechanism includes a plurality of legs which are integral with the press plate and extend into a plurality of holes formed in the circuit board.

3. The liquid crystal display panel holder according to claim 2, wherein each of the plurality of legs has, at the tip end thereof, a hook configured to be engaged by an opening edge of the hole on the back surface side of the circuit board.

4. The liquid crystal display panel holder according to claim 1, wherein a space having a width approximately equal to the width of the rubber connector is provided between the holding portion and the first rib.

5. The liquid crystal display panel holder according to claim 4, wherein the holding portion is formed by a bend in the end portion of one of the second and third ribs adjacent to the first rib and parallel with the first rib.

6. The liquid crystal display panel holder according to claim 4, wherein a protrusion is formed on a surface of the first rib at a location facing the holding portion, and the distance between an apex of the protrusion and the holding portion is smaller than the width of the rubber connector.

7. The liquid crystal display panel holder according to claim 5, wherein the end portion of one of the second and third ribs adjacent to the first rib is divided into two portions by a slit extending in parallel with the frame portion, and the portion between the slit and an edge of the rib is bent, thereby forming the holding portion.

8. The liquid crystal display panel holder according to claim 7, wherein the edge of one of the second and third ribs between the frame portion and the slit adjacent to the first rib is closer to the first rib than the bend position of the holding portion.

9. The liquid crystal display panel holder according to claim 1, wherein the holding portions project from both the end portion of the second rib adjacent to the first rib and the end portion of the third rib adjacent to the first rib.

10. The liquid crystal display panel holder according to claim 1, said first rib and said holding portion contacting said prismatic rubber connector on opposite sides, the liquid crystal display panel and the circuit board contacting sides of said prismatic rubber connector extending transverse to said opposite sides.

11. The liquid crystal display panel holder according to claim 1, each of said ribs extending substantially perpendicular to a major plane of said rectangular frame portion.

12. A liquid crystal display panel holder configured to secure a liquid crystal display panel and a circuit board, said panel holder comprising:

a press plate having a rectangular frame portion configured to contact a top surface of the liquid crystal display panel, said frame portion extending in a first plane, a first rib extending from an edge of the frame portion, second and third ribs extending from parallel edges of said frame portion and perpendicular to said first rib, each of said first, second and third ribs extending in planes substantially perpendicular to the first plane, a holding portion projecting from at least one of the second and third ribs and extending parallel to said first rib, a space between said holding portion and said first rib being configured to receive therein a rubber connector that connects the liquid crystal display panel with the circuit board; and a fixing mechanism configured to secure the press plate to the circuit board, said fixing mechanism being located at an extremity of at least said first rib, and being integral with said press plate.

* * * * *